United States Patent
Hsieh et al.

(10) Patent No.: US 7,321,325 B2
(45) Date of Patent: Jan. 22, 2008

(54) BACKGROUND CALIBRATION OF CONTINUOUS-TIME DELTA-SIGMA MODULATOR

(75) Inventors: Hong-Yean Hsieh, Sunnyvale, CA (US); Chia-Liang Lin, Union City, CA (US)

(73) Assignee: Realtek Semiconductor Corp., Hsinchu (TW)

(*) Notice: Subject to any disclaimer, the term of this patent is extended or adjusted under 35 U.S.C. 154(b) by 9 days.

(21) Appl. No.: 11/389,990

(22) Filed: Mar. 27, 2006

(65) Prior Publication Data
US 2007/0008200 A1    Jan. 11, 2007

Related U.S. Application Data

(60) Provisional application No. 60/595,455, filed on Jul. 7, 2005.

(51) Int. Cl.
*H03M 3/00* (2006.01)
(52) U.S. Cl. ........................... 341/143; 341/120
(58) Field of Classification Search ......... 341/120–155
See application file for complete search history.

(56) References Cited

U.S. PATENT DOCUMENTS

| | | | |
|---|---|---|---|
| 4,558,361 A | | 12/1985 | Catros |
| 4,700,173 A | * | 10/1987 | Araki et al. ................. 341/122 |
| 4,751,496 A | | 6/1988 | Araki |
| 4,943,807 A | | 7/1990 | Early et al. |
| 5,012,244 A | | 4/1991 | Wellard et al. |
| 5,416,481 A | * | 5/1995 | Chen .......................... 341/131 |
| 5,729,230 A | | 3/1998 | Jensen et al. |
| 5,835,038 A | * | 11/1998 | Nakao et al. ............... 341/131 |
| 5,889,482 A | | 3/1999 | Zarubinsky |
| 6,016,113 A | | 1/2000 | Binder |
| 6,064,871 A | | 5/2000 | Leung |

(Continued)

FOREIGN PATENT DOCUMENTS

EP    0084353 A2    7/1983

(Continued)

OTHER PUBLICATIONS

Paton, Susan et al., A 70—mW 300 MHz CMOS continuous-Time SD ADC with 15 MHz Bandwidth and 11 Bits of Resolution,: IEEE Journal of Solid—State Circuits, vol. 39, No. 7, Jul. 2004.

(Continued)

*Primary Examiner*—Lam T. Mai
(74) *Attorney, Agent, or Firm*—Knobbe, Martens, Olson & Bear LLP

(57) ABSTRACT

A primary delta-sigma modulator converts a continuous-time input signal into a discrete-time output sequence. A calibration circuit comprising an auxiliary delta-sigma modulator estimates percentage error in an integrator time constant and adjusts the time constant of at least one integrator in the primary delta-sigma modulator accordingly. The auxiliary delta-sigma modulator and the primary delta-sigma modulator use integrators with substantially similar circuit designs. The percentage error in the time constant of the integrator in the auxiliary delta-sigma modulator, and correspondingly the percentage error in time constant of the integrator in the primary delta-sigma modulator, is estimated by injecting a calibrating sequence into the auxiliary delta-sigma modulator and examining a correlation between an error sequence and an output sequence of the auxiliary delta-sigma modulator.

32 Claims, 12 Drawing Sheets

U.S. PATENT DOCUMENTS

| | | | |
|---|---|---|---|
| 6,087,969 | A | 7/2000 | Stockstad et al. |
| 6,184,812 | B1 | 2/2001 | Younis et al. |
| 6,271,782 | B1 | 8/2001 | Steensgaard-Madsen |
| 6,346,898 | B1 | 2/2002 | Melanson |
| 6,351,229 | B1 * | 2/2002 | Wang ................... 341/143 |
| 6,362,763 | B1 | 3/2002 | Wang |
| 6,396,428 | B1 | 5/2002 | Cheng |
| 6,445,318 | B1 | 9/2002 | Ruha et al. |
| 6,462,685 | B1 * | 10/2002 | Korkala .................. 341/131 |
| 6,473,019 | B1 | 10/2002 | Ruha et al. |
| 6,657,500 | B1 | 12/2003 | Chen |
| 6,670,902 | B1 | 12/2003 | Melanson et al. |
| 6,680,682 | B2 * | 1/2004 | Arnaud et al. .......... 341/155 |
| 6,693,572 | B1 | 2/2004 | Oliaei et al. |
| 6,765,517 | B1 | 7/2004 | Ali |
| 6,791,400 | B2 | 9/2004 | Lou |
| 6,838,929 | B2 | 1/2005 | Mitteregger |
| 6,880,262 | B1 | 4/2005 | Jensen |
| 6,930,624 | B2 | 8/2005 | Hezar et al. |
| 6,940,434 | B2 | 9/2005 | Brooks |
| 6,980,145 | B1 | 12/2005 | Tammineedi |
| 7,042,375 | B1 * | 5/2006 | van Engelen ............ 341/131 |
| 7,095,345 | B2 | 8/2006 | Nguyen et al. |
| 7,098,730 | B1 | 8/2006 | Shui |
| 7,129,873 | B2 | 10/2006 | Kawamura |
| 2005/0030212 | A1 | 2/2005 | Brooks |
| 2005/0128111 | A1 | 6/2005 | Brooks |
| 2006/0139109 | A1 | 6/2006 | Oustaloup et al. |

FOREIGN PATENT DOCUMENTS

| | | |
|---|---|---|
| EP | 0964524 A2 | 12/1999 |
| EP | 1418674 A1 | 5/2004 |
| JP | 60263534 A | 6/1984 |
| JP | 2003258644 | 9/2003 |
| WO | WO 00/63786 A | 10/2000 |

OTHER PUBLICATIONS

Yan, Shouli, et al., "A Continuous-Time SD Modulator with 88-dB Dynamic Range and 1.1 MHz Signal Bandwidth," IEEE Journal of Solid-State Circuits, vol. 39, No. 1, Jan. 2001.

GB Search and Examination Report dated Nov. 23, 2006.

Xia, Bo et al., An RC Time Constant Auto-Tuning Structure for High Linearity Continuous-Time Modulators and Active Filters, IEEE Transactions on Circuits and Systems, pp. 2179-2188, I: Regular Papers, vol. 51, No. 11, Nov. 2004.

Norsworthy S R et al.: "Delta-SIGMA Data Converters" Delta-SIGMA Data Converters. Theory Design, and Simulation, New York, NY: IEEE, US, 1997, pp. 197-199, 309-313, XP002322216 ISBN: 0-7803-1045-4.

Norsworthy S R et al. Institute of Electrical and Electronics Engineers: "Effective Dithering of SIGMA-Delta Modulators" Proceedings of the International Symposium on Circuits and Systems. (ISCAS), New York, IEEE, US, vol. vol. 4 CONF. 25, May 3, 1992, pp. 1304-1307, XP010061387 ISBN: 0-7803-0593-0.

Silva, J. et al., "Wideband low-distortion delta-sigma ADC topology". Electronics Letters, Jun. 7, 2001, vol. 37, No. 12, pp. 737-738.

Wu, X., et al., "One-bit processing for digital control". IEE Proc.-Control Theory Appl., vol. 152, No. 4, Jul. 2005, pp. 403-410.

* cited by examiner

BACKGROUND CALIBRATION OF
CONTINUOUS-TIME DELTA-SIGMA
MODULATOR

The present application claims priority benefits under 35 U.S.C. § 119(e) from U.S. Provisional Application No. 60/595,455, filed on Jul. 7, 2005, entitled "Background Calibration of Continuous-Time Delta-Sigma Modulator," which is hereby incorporated herein in its entirety by reference.

BACKGROUND OF THE INVENTION

1. Field of the Invention

The present invention relates to a delta-sigma modulator and in particular to a method and apparatus for calibrating a continuous-time delta-sigma modulator.

2. Description of the Related Art

Delta-sigma modulators are widely used in over-sampling analog-to-digital converters (ADC) to achieve high-resolution analog-to-digital data conversion despite using coarse quantization. To date, most delta-sigma modulators use discrete-time loop filters. There has been much interest lately to use continuous-time loop filters. FIG. 1 depicts a block diagram of a typical delta-sigma modulator 200 that employs a continuous-time loop filter. For example, a continuous-time (or analog) input signal x(t) is fed to a quantizer 240 via a continuous-time loop filter 230 and converted into a discrete-time output sequence y[n]. The output sequence y[n] is fed back via a digital-to-analog converter (DAC) 260 to the continuous-time loop filter 230 as a second input. The quantizer 240 converts an input continuous-time signal into a discrete-time sequence at a rate controlled by a clock. The continuous-time loop filter 230 is usually constructed using one or more continuous-time integrators which are designed to mimic an ideal response of $1/(sT)$, where T corresponds to a period of the clock. The continuous-time loop filter 230 also involves one or more signal routing and summing. For instance, a third order continuous-time loop filter 230 using three continuous-time integrators and three summing operations is depicted in FIG. 2.

The modulator output sequence y[n] is determined by the continuous-time input signal x(t), quantization error due to the quantizer 240, and response of the continuous-time loop filter 230. Although an explicit sampling circuit does not exist in the modulator 200 to convert the continuous-time input signal x(t) into the discrete-time sequence x[n], there is an implicit sampling operation performed on x(t) due to the quantizer 240 that operates synchronously with the clock. In accordance with the clock, the quantizer 240 generates a discrete-time output sequence which is also the output sequence y[n] of the modulator 200.

Equivalence theorem states that the continuous-time input signal x(t) can be represented equivalently by the discrete-time sequence x[n]=x(t=nT) as far as its effects to the discrete-time output sequence y[n] are concerned. Along this line of thinking, FIG. 3 depicts a behavioral model commonly used to model the continuous-time delta-sigma modulator 200. For example, a sampler 205 converts the continuous-time input signal x(t) into the discrete-time sequence x[n]. The behavior of the quantizer 240 is modeled as adding a quantization error sequence q[n] into the system. The discrete-time sequence x[n] is filtered by a signal transfer function STF(z) 245 while the quantizer error sequence q[n] is filtered by a noise transfer function NTF(z) 255. An output of STF(z) 245 is summed with an output of NTF(z) 255 in a summer 265 to result in the modulator output sequence y[n]. Both STF(z) 245 and NTF(z) 255 are determined by the loop filter 230. For example, the noise transfer function NTF(z) 255 corresponding to the third order continuous-time loop filter 230 depicted in FIG. 2 is as follows:

$NTF(z)=1/(1+L(z))$, where $L(z)=g_1/(z-1)+g_2/2\cdot(z+1)/(z-1)^2+g_3/6\cdot(z^2+4z+1)/(z-1)^3$.

Internal parameters of the continuous-time loop filter 230 (e.g., coefficients $g_1$, $g_2$, and $g_3$ in the loop filter 230 shown in FIG. 2) are chosen to achieve a target noise transfer function. Usually, it is desirable to have a noise transfer function that strongly suppresses the quantization noise within a band of interest and thus improves an in-band signal-to-quantization-noise ratio. For example, a choice of $g_1=11/6$, $g_2=2$, and $g_3=1$ would result in a classic third order noise transfer function of $(1-z^{-1})^3$.

When implementing a modulator in an integrated circuit, the internal parameters of the loop filter 230 (e.g., the coefficients g1, g2, and g3 of the loop filter 230 shown in FIG. 2) are usually determined by ratios between resistors or capacitors. Modern integrated circuits usually provide good matching between values of circuit components of the same kind. Although for each individual resistor/capacitor the value may be off by as much as 30%, for example, the ratio between the values of two resistors/capacitors of the same kind is usually very accurate (e.g., accurate to within 0.1%). Therefore, the effective values of the coefficients g1, g2, and g3 usually can be controlled very well in an integrated circuit. The biggest problem usually arises from the inaccuracies within the integrators.

A continuous-time integrator is usually implemented either by an OTA-C integrator shown in FIG. 4A or an R-C integrator shown in FIG. 4B. For the OTA-C integrator, an input voltage is converted into an output current by an operational transconductance amplifier (OTA). The output current is then integrated by a capacitor and converted into an output voltage. The voltage transfer function of the OTA-C integrator is $G_m/(sC)$, which matches the desired response of $1/(sT)$ if the transconductance $G_m$ and capacitor C are properly chosen such that $T=C/G_m$, i.e., the "time constant" $C/G_m$ is equal to the clock period. For the R-C integrator, due to the high gain of the operational amplifier, the transfer function for the input voltage to the output voltage is $1/(sRC)$, which matches the desired response of $1/(sT)$ if the values of resistor R and capacitor C are properly chosen such that T=RC, i.e., the "time constant" RC is equal to the clock period.

However, in practice, there is always spread in component values in a real circuit. For example, in a typical complementary metal oxide semiconductor (CMOS) integrated circuit, the uncertainty in the transconductance, resistor, and capacitor values may cause the value of $C/G_m$ or RC of an integrator to deviate from its design value by up to 30%. This usually causes performance degradation to the modulator. Worse yet, it may result in instability and cause the system to fail. In addition, both $C/G_m$ and RC are temperature dependent. Therefore, even if the value of $C/G_m$ or RC is calibrated at start-up, it may deviate from the initial value as the temperature drifts.

SUMMARY OF THE INVENTION

The present invention solves these and other problems by providing a calibration circuit that adjusts time constants of one or more integrators in a continuous-time delta-sigma modulator at start-up, intermittently, in response to a command signal, periodically or continuously. In one embodiment, a primary delta-sigma modulator is used to convert a continuous-time input signal into a discrete-time output sequence. The calibration circuit uses an auxiliary delta-sigma modulator to estimate an integrator time constant (or a relative error in an integrator time constant) and adjusts a time constant of at least one integrator in the primary delta-sigma modulator accordingly. For example, the auxiliary delta-sigma modulator includes a continuous-time loop filter with at least one integrator that has a substantially similar circuit design as the integrator in the primary delta-sigma modulator.

In one embodiment, the auxiliary delta-sigma modulator is a first order modulator with one integrator, a coarse (e.g., 5 levels) quantizer, and a coarse feedback digital-to-analog converter. The auxiliary delta-sigma modulator is configured to generate an error sequence and an auxiliary output sequence in response to a calibrating sequence. The error sequence contains additive noise due to the calibrating sequence.

An estimator circuit generates an estimation signal based on the error sequence and the auxiliary output sequence. The estimation signal is indicative of relative error in a time constant of the integrator in the auxiliary delta-sigma modulator. A controller circuit adjusts the time constant of the integrator in the primary delta-sigma modulator according to the estimation signal. For example, the controller circuit outputs one or more controls signals to selectively connect circuit components (e.g., capacitors or resistors) in an array to the integrator to adjust its time constant. In one embodiment, the controller circuit also adjusts the time constant of the integrator in the auxiliary delta-sigma modulator.

In one embodiment, the estimator circuit includes an adaptive filter to estimate a noise transfer function of the auxiliary delta-sigma modulator by examining correlation between the error sequence and the auxiliary output sequence. For example, an adaptive finite impulse response (FIR) filter or an adaptive infinite impulse response (IIR) filter based on a least mean square (LMS) algorithm or other algorithms can be used to characterize a correlation between the error sequence and the auxiliary output sequence. In one embodiment, the estimator circuit further includes a summing circuit to add two or more filter coefficients upon convergence of the adaptive filter to generate the estimation signal which indicates the percentage error in the time constant of the integrator in the auxiliary delta-sigma modulator.

In one embodiment, a calibrating sequence generator provides the calibrating sequence (e.g., a pseudo-random noise sequence or a periodic sequence). The calibrating sequence can be injected before or after the quantizer in the auxiliary delta-sigma modulator. In one embodiment, the auxiliary delta-sigma modulator includes a local feedback loop to compensate for excess delay. One embodiment of the local feedback loop includes a round-off function coupled between a quantizer output and the output of the auxiliary delta-sigma modulator, a data flip-flop coupled between the output of the auxiliary delta-sigma modulator and an input to the feedback digital-to-analog converter, a gain element with an input coupled to the input of the feedback digital-to-analog converter, and a summing circuit configured to subtract an output of the gain element from a sequence at the quantizer output. In embodiments with this local feedback loop, the calibrating sequence can be injected at an input to the round-off function or at an output of the round-off function. The error sequence generated by the auxiliary delta-sigma modulator contains additive noise due to the calibrating sequence and the round-off function.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENT

The present invention relates to a method and apparatus for calibrating a delta-sigma modulator. While the specification describes several example embodiments of the invention, it should be understood that the invention can be implemented in many way and is not limited to the particular examples described below or to the particular manner in which any features of such examples are implemented.

As mentioned above, continuous-time integrators are basic building blocks of a continuous-time delta-sigma modulator (DSM). The continuous-time integrators are implemented using either an OTA-C circuit or an R-C circuit. Both are characterized by a "time constant." For the OTA-C circuit, the "time constant" is $C/G_m$; for the R-C circuit, the "time constant" is RC. Inaccuracies of the time constants are major causes for the noise-shaping behavior of a DSM (or modulator) to deviate from a design target. Although the time constant of an integrator can deviate significantly from its nominal value in an integrated circuit, matching between the time constants of two integrators is usually very good. For example, if one integrator has a time constant that is 30% greater than a nominal design value, then another integrator of a similar kind within the same integrated circuit will also have a time constant that is about 30% greater than the nominal design value. Since integrators of a similar design match well in terms of the percentage of error in their time constants, an estimate of the time constant for one integrator can be used as a base line to adjust the time constants of other integrators closer to their respective design targets.

Figure 1:
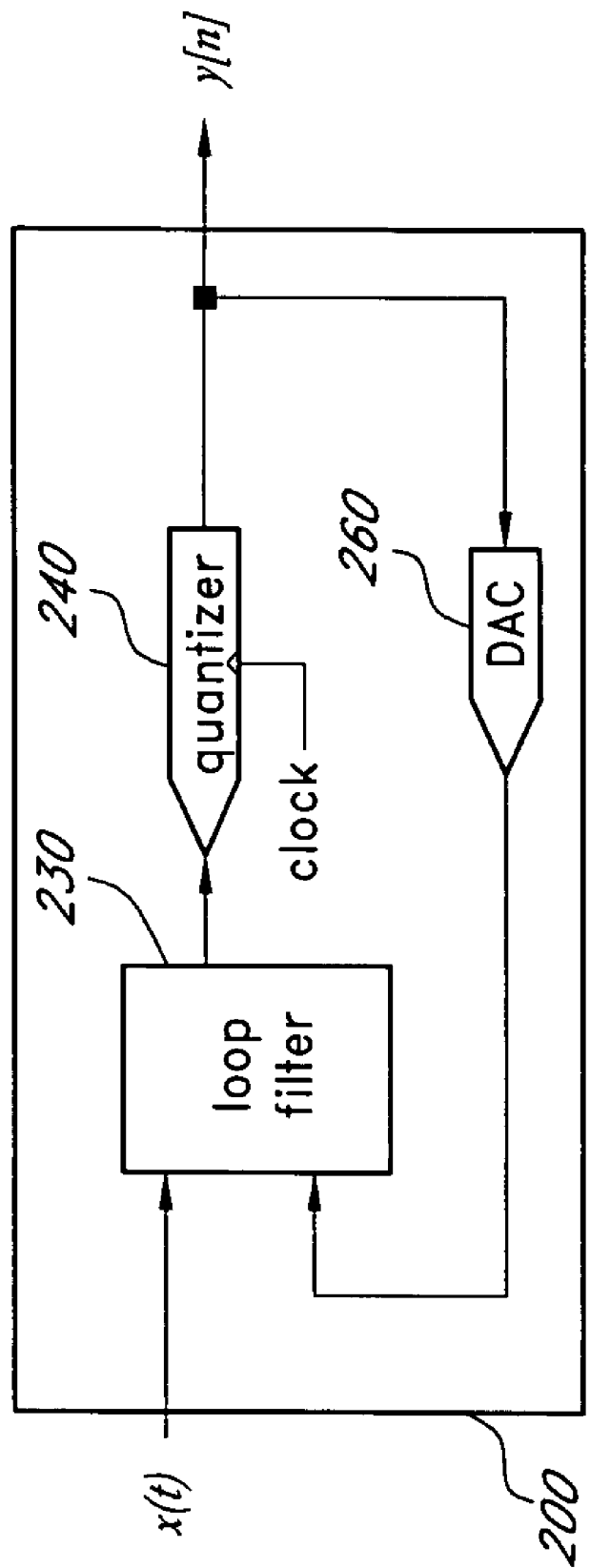
FIG. 1 is a block diagram of one embodiment of a delta-sigma modulator that uses a continuous-time loop filter.
Figure 2:
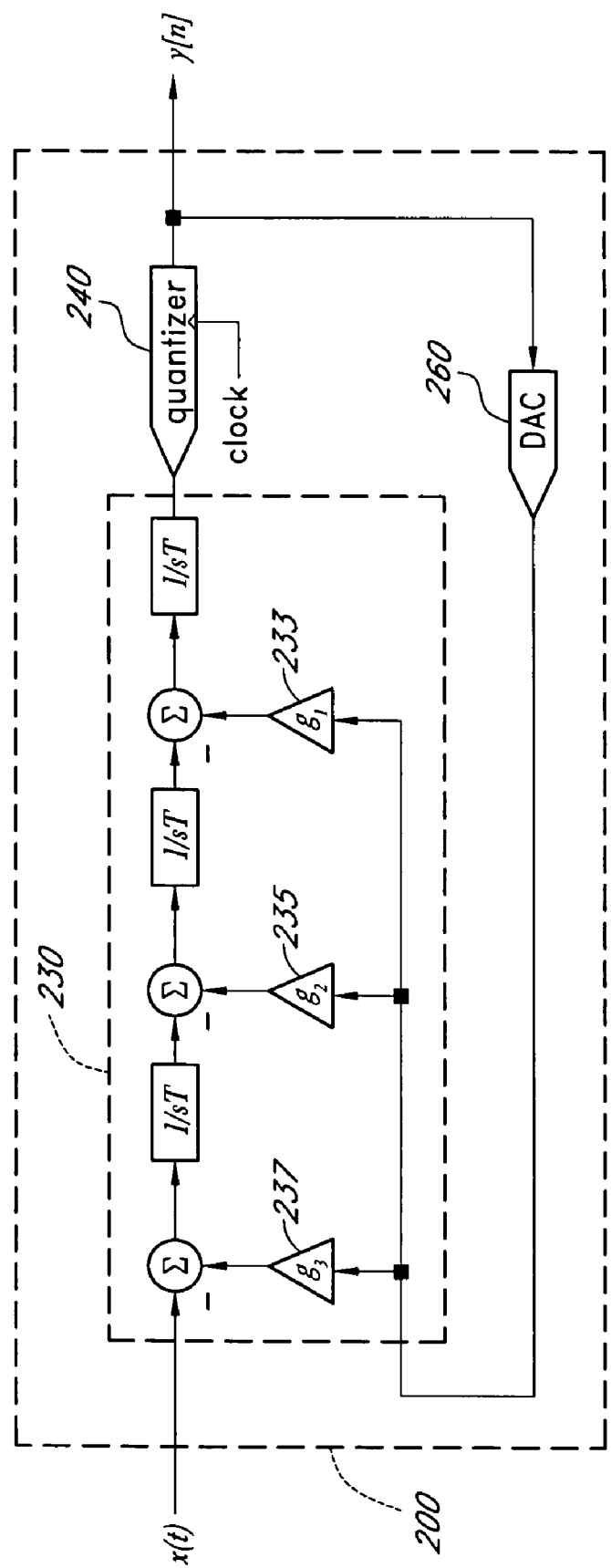
FIG. 2 illustrates one embodiment of a third order continuous-time loop filter using three integrators.
Figure 3:
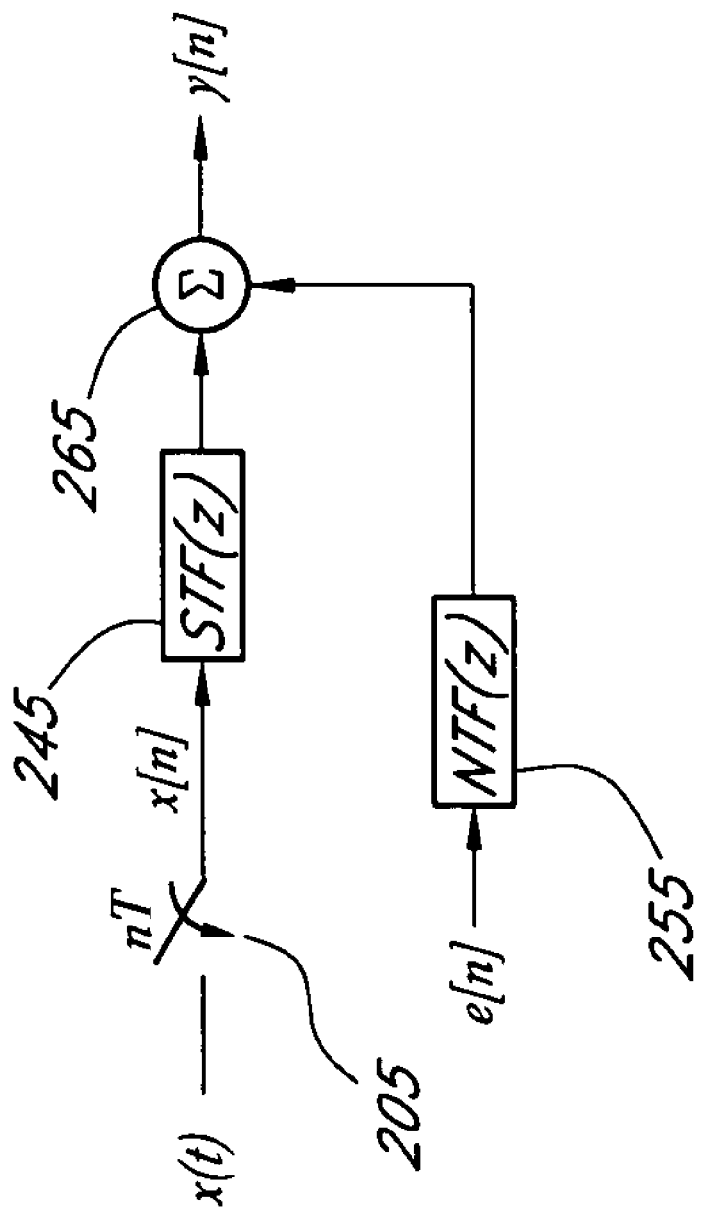
FIG. 3 illustrates one embodiment of a behavioral model for a continuous-time delta-sigma modulator.
Figure 4B:
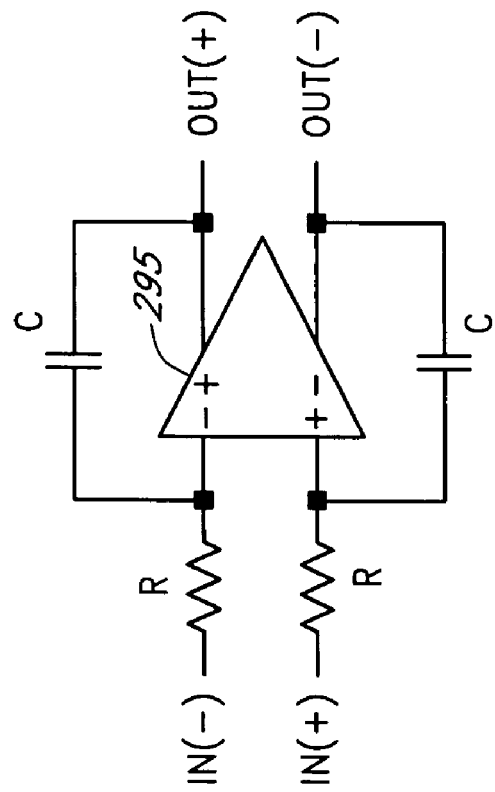
FIG. 4B is a schematic diagram of another embodiment of a continuous-time integrator.
Figure 4A:
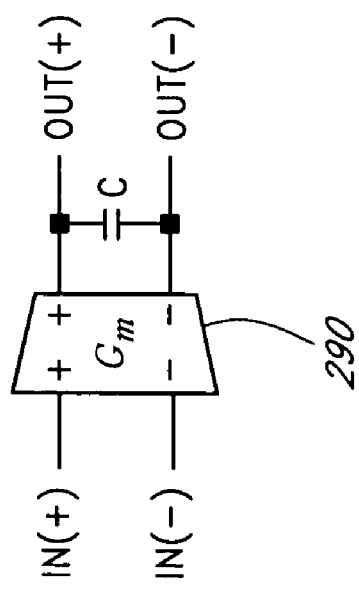
FIG. 4A is a schematic diagram of an embodiment of a continuous-time integrator.
Figure 5:
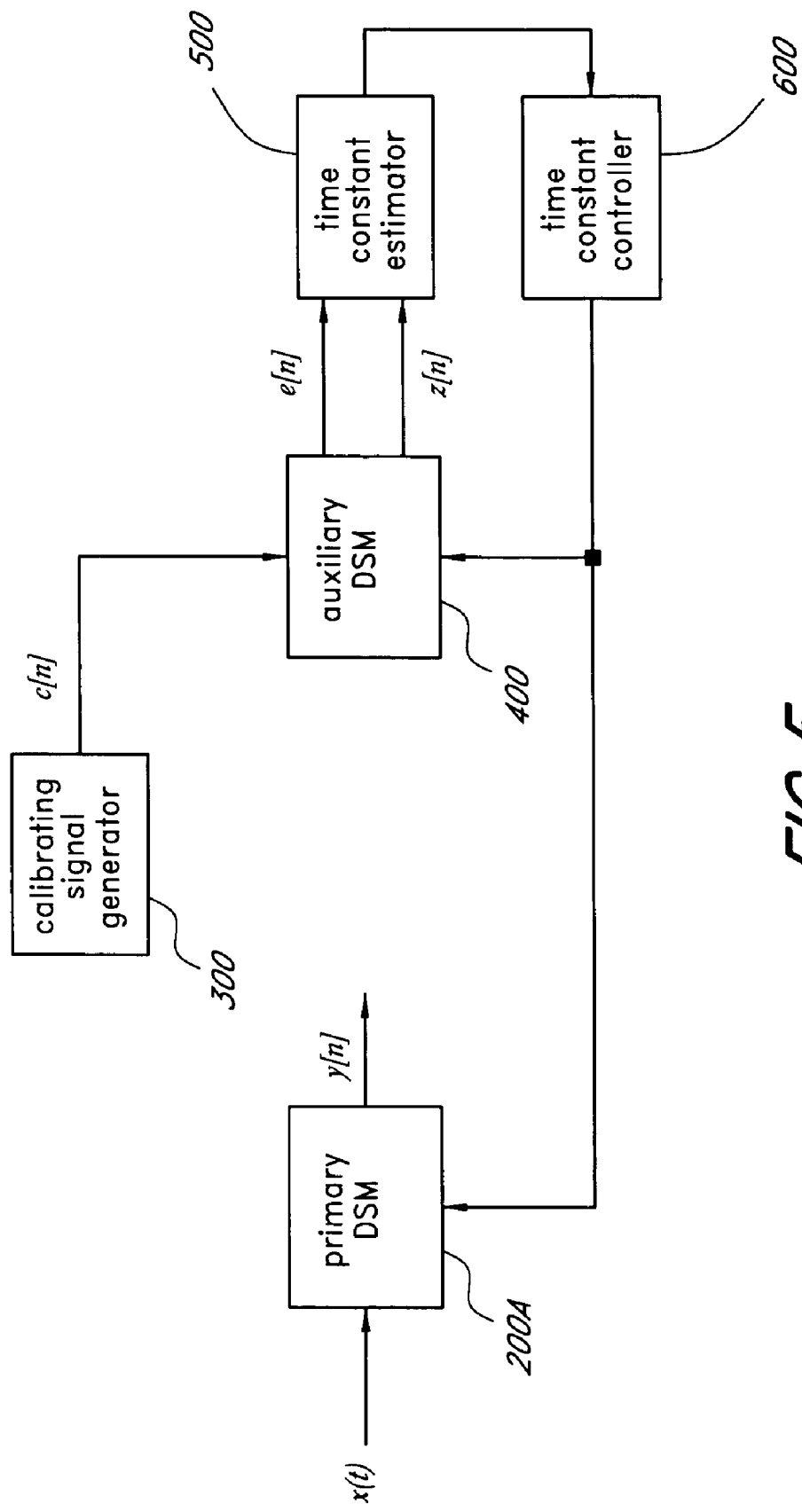
FIG. 5 is a block diagram of one embodiment of a calibration circuit that uses an auxiliary delta-sigma modulator to adjust an integrator time constant in a primary delta-sigma modulator.

A method of calibrating a continuous-time delta-sigma modulator in accordance with the present invention is depicted in FIG. 5. FIG. 5 illustrates one embodiment of a calibration circuit that calibrates a time constant in a primary DSM 200A. The primary DSM 200A is the modulator in use and converts an input continuous-time analog signal x(t) into an output sequence y[n]. In one embodiment, the calibration circuit comprises an auxiliary DSM 400, a calibrating signal generator 300, a time constant estimator 500, and a time constant controller 600. In one embodiment, the primary DSM 200A and the auxiliary DSM 400 use substantially similar circuit designs to implement their internal continuous-time integrators. Integrators of similar circuit designs match well in terms of percentage error in their time constants. Thus, the auxiliary DSM 400 can be used as a test circuit to estimate a percentage error in the time constants of the internal continuous-time integrators in the primary DSM 200A. The time constants of internal continuous-time integrators in the primary DSM 200A can be adjusted (or calibrated) according to one or more control signals generated by the time constant controller 600.

In one embodiment, the auxiliary DSM 400 is designed for calibration test and is not designed with an input for processing a continuous-time input signal. For example, the auxiliary DSM 400 is a relatively simple design (e.g., a first order modulator with a coarse quantizer) to reduce system overhead. The calibrating signal generator 300 generates a calibrating sequence c[n], which can be a pseudo-random noise (PN) sequence or a periodic sequence. The calibrating sequence c[n] is injected into the auxiliary DSM 400 before or after an internal quantizer (e.g., a two-bit quantizer). The auxiliary DSM 400 generates an error sequence e[n] and an output sequence z[n] in response to the calibrating sequence c[n]. The error sequence is additive noise to the auxiliary DSM 400 resulting from the calibrating sequence. The output sequence is correlated to the calibrating sequence.

The time constant estimator 500 examines correlation between the error sequence e[n] and the output sequence z[n] of the auxiliary DSM 400 to extract (or estimate) an integrator time constant. The decision is provided to the controller 600 (e.g., via a time constant estimation signal), and the controller 600 sends the control signals to adjust the time constants of the integrators in primary DSM 200A. In one embodiment, the time constant of an integrator in the auxiliary DSM 400 is also adjusted. The time constants can be calibrated at start-up, intermittently, in response to a command signal, periodically or continuously. For example, the time constants can be adjusted while the primary DSM 200A is processing the input signal.

Figure 6:
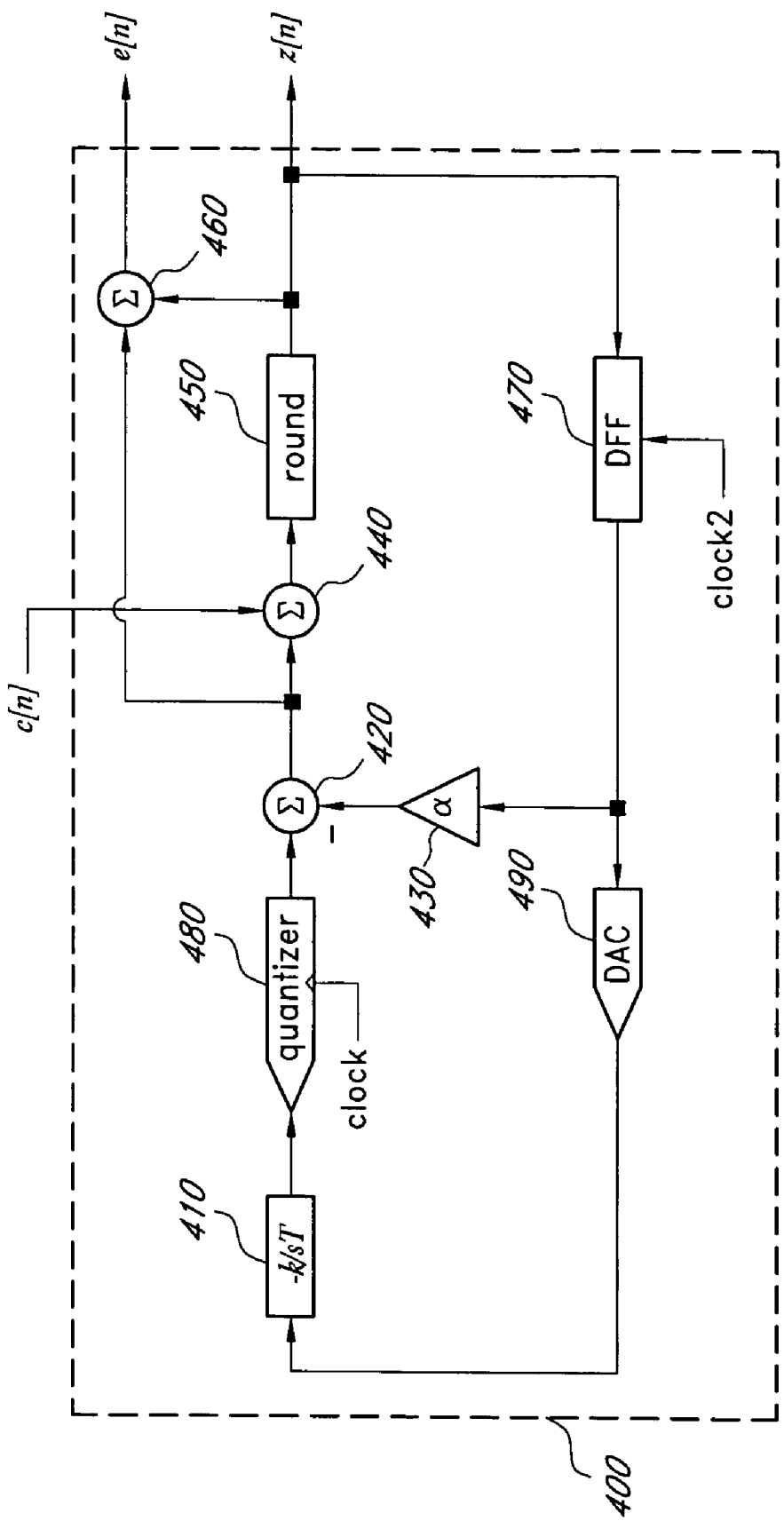
FIG. 6 is a block diagram of one embodiment of an auxiliary delta-sigma modulator in the calibration circuit shown in FIG. 5.

FIG. 6 depicts an exemplary embodiment of the auxiliary DSM 400 in accordance with the present invention. The auxiliary DSM 400 shown in FIG. 6 is a first order modulator comprising an integrator 410, a quantizer (e.g., a coarse quantizer with 5 levels) 480, and a coarse digital-to-analog converter (DAC) 490. The integrator 410 has a transfer function of $-k/sT$, where T corresponds to a clock period and a nominal value for a time constant, and where k is a factor that indicates percentage error in the time constant of the integrator 410. For example, the time constant is 30% smaller than the nominal value if k=1.3. The negative sign in the transfer function of the integrator 410 denotes a negative feedback from the DAC 490.

In one embodiment, the auxiliary DSM 400 further includes a local feedback loop to compensate for excess delay. For example, the local feedback loop comprises a round-off function 450, a data flip-flop (DFF) 470, a feedback gain factor 430, and a summer 420. In one embodiment, the DFF 470 operates at a clock (clock 2) that has a delay time of d·T compared to a clock for the quantizer 480. The calibrating sequence c[n] can be injected before or after the round-off function 450. A summer 460 calculates the additive noise injected into a processing loop of the auxiliary DSM 400 due to the calibrating sequence c[n] and the round-off function 450. The error sequence e[n] is generated at an output of the summer 460. The output sequence z[n] of the auxiliary DSM 400 is taken from an input of the DFF 470. As discussed in further details below, the percentage error in the time constant of the integrator 410, which is represented in the factor k, can be extracted by examining the correlation between the error sequence e[n] and the output sequence z[n] of the auxiliary DSM 400.

Figure 7:
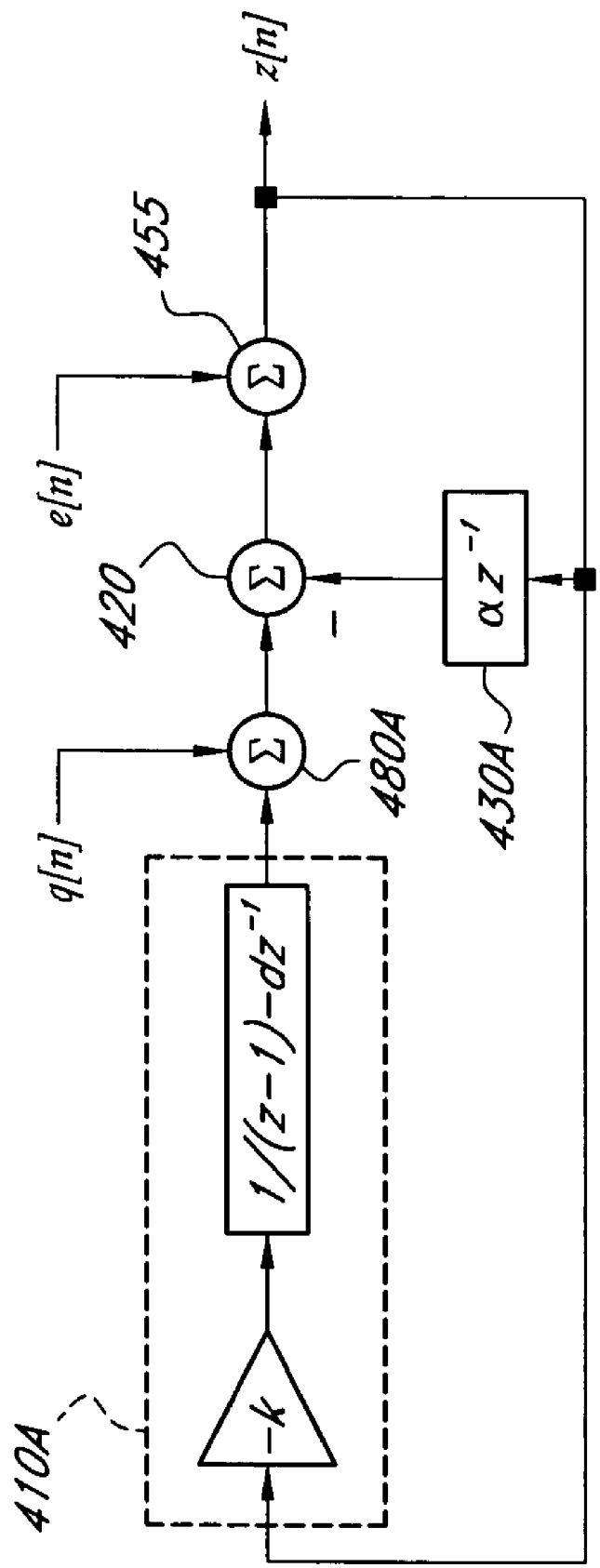
FIG. 7 illustrates one embodiment of a behavioral model for the auxiliary delta-sigma modulator shown in FIG. 6.

A behavioral model of the auxiliary DSM 400 is depicted in FIG. 7 with the integrator 410 in the presence of excess delay (d·T) modeled as a discrete-time filter with a response of $1/(z-1)-d \cdot z^{-1}$ scaled by a gain factor of $-k$. The negative sign of the gain factor models negative feedback and the scaling factor k models the percentage error in the time constant of the integrator 410. Quantization error caused by the quantizer 480 is modeled as an additive noise sequence q[n] that is injected into the auxiliary DSM (or modulator) 400 via a summer 480A. The local feedback loop formed by the DFF 470 and the gain block 430 is modeled by a filter 430A. Additive noise due to the calibrating sequence c[n] and the round-off function 450 is modeled as another additive noise sequence e[n] that is injected into the auxiliary DSM 400 via a summer 455. Using this model, the output sequence z[n] in response to q[n] and e[n] is derived as follows:

$$Z(z)=[Q(z)+E(z)] \cdot [1-z^{-1}]/[1+(\alpha+k-k \cdot d-1) \cdot z^{-1}+(k \cdot d-\alpha) \cdot z^{-2}]; \text{ or simply}$$

$$Z(z)=[Q(z)+E(z)] \cdot NTF(z).$$

Z(z), Q(z), and E(z) are z-transforms of z[n], q[n], and e[n] respectively. The noise transfer function NTF(z) has the following relationship:

$$NTF(z)=[1-z^{-1}]/[1+(\alpha+k-k \cdot d-1) \cdot z^{-1}+(k \cdot d-\alpha) \cdot z^{-2}].$$

The correlation between z[n] and e[n] is determined by the noise transfer function, from which the scaling factor k and accordingly the percentage error in the time constant of the integrator 410 can be extracted.

Figure 8:
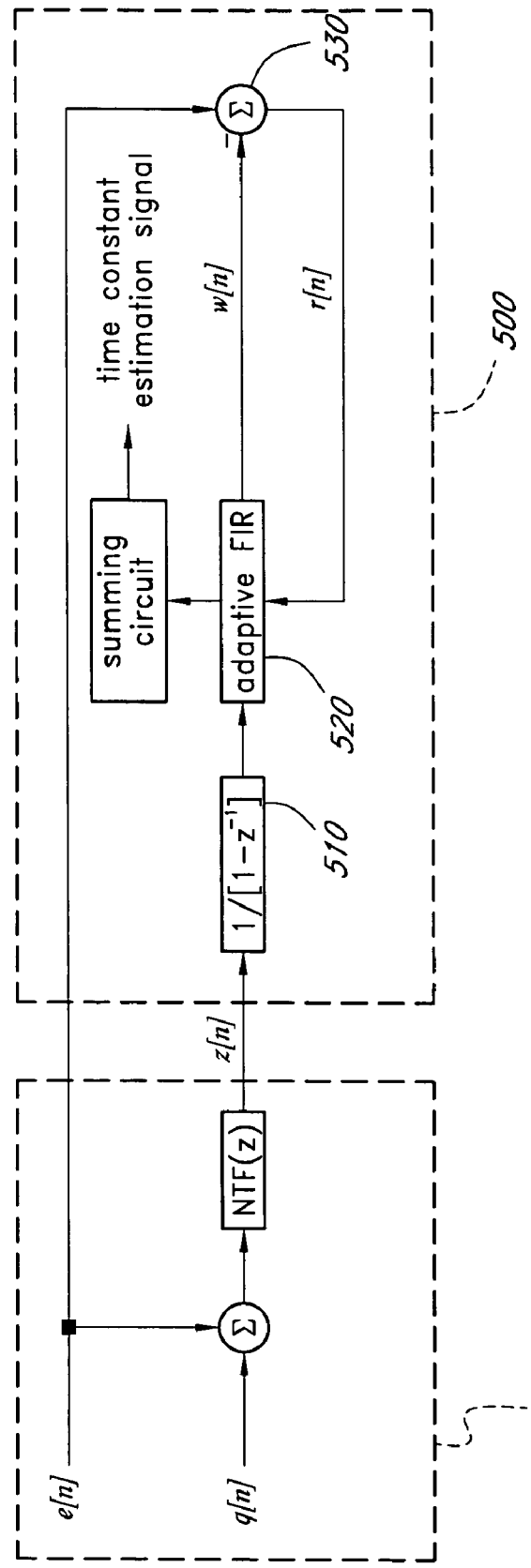
FIG. 8 illustrates one embodiment of a time constant estimator.

In one embodiment of the present invention, we use an adaptive finite impulse response (FIR) filter to estimate the noise transfer function of the auxiliary DSM 400 as shown in FIG. 8. The auxiliary DSM 400 is modeled behaviorally according to the relations among z[n], q[n] and e[n] described above. The error sequence e[n] and the output sequence z[n] are passed to the time constant estimator 500. In one embodiment, the time constant estimator 500 comprises an infinite impulse response (IIR) filter (e.g., a discrete-time integrator $1/[1-z^{-1}]$) 510, an adaptive FIR filter 520, and a summer 530. After being properly adapted, the adaptive FIR filter 520 in cascade with the fixed IIR filter (or integrator) 510 would form the following response:

$$[1+c_1 \cdot z^{-1}+c_2 \cdot z^{-2}]/[1-z^{-1}], \text{ where}$$

$$c_1 = \alpha + k - k \cdot d - 1 \text{ and}$$

$$c_2 = k \cdot d - \alpha.$$

In other words, the discrete-time integrator 510 in cascade with the adaptive FIR filter 520 results in a response that is the reciprocal of the NTF(z). In this manner, the integrator 510 and the adaptive FIR filter 520 will undo what the auxiliary DSM 400 has done to the error sequence e[n]. The difference between the error sequence e[n] and an output w[n] of the adaptive FIR filter 520 is computed using the summer 530, resulting in a residual sequence r[n] which is used to adapt the FIR filter 520 so as to minimize the residual sequence r[n].

Figure 9:
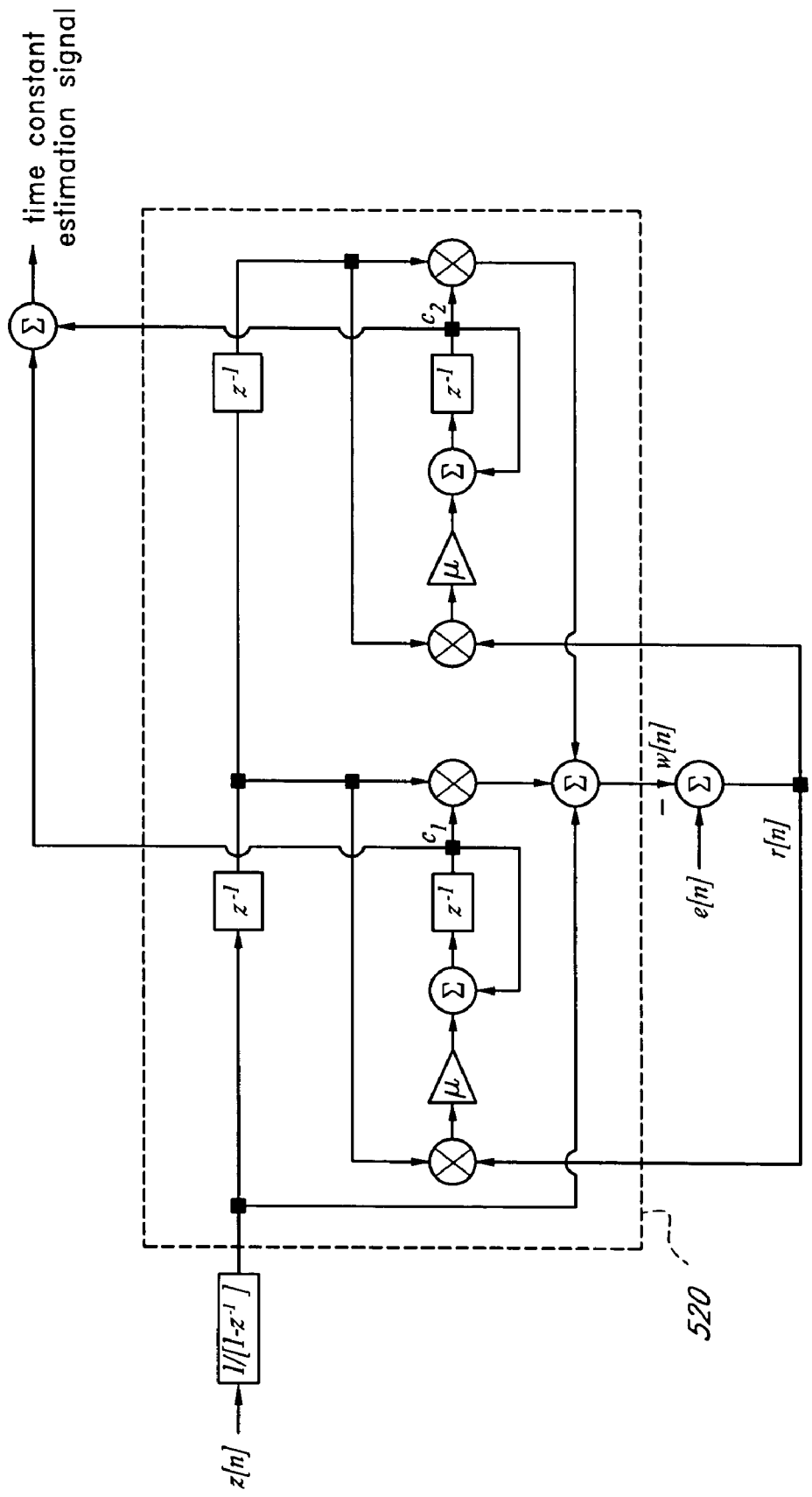
FIG. 9 illustrates one embodiment of an adaptive filter.

FIG. 9 depicts an exemplary embodiment of the adaptive FIR filter 520. The adaptive FIR filter 520 includes a gain factor $\mu$ corresponding to an adaptation step size. In one embodiment, the adaptation step size needs to be small enough for the adaptive FIR filter 520 to converge. In one configuration, the adaptive FIR filter 520 minimizes the residual sequence r[n] using a least-mean-square adaptation scheme. Other adaptation schemes (or algorithms) are also possible.

Upon convergence of the adaptive FIR filter 520, the sum of the filter coefficients $c_1$ and $c_2$ has the following relationship:

$$c_1 + c_2 = k - 1.$$

In other words, the sum of the filter coefficients indicates the relative error of the time constant for the integrator 410 in the auxiliary DSM 400. For example, if $c_1 + c_2 = 0.1$ upon convergence, the time constant of the integrator 410 is approximately 10% smaller than a design value. In this manner, the time constant estimator 500 estimates the relative error of the time constant. The information (e.g., a time constant estimation signal) is then passed to the time constant controller 600 to adjust the time constant of at least one internal integrator in the primary DSM 200A. In one embodiment, the time constant of the integrator 410 is also adjusted.

Figure 10:
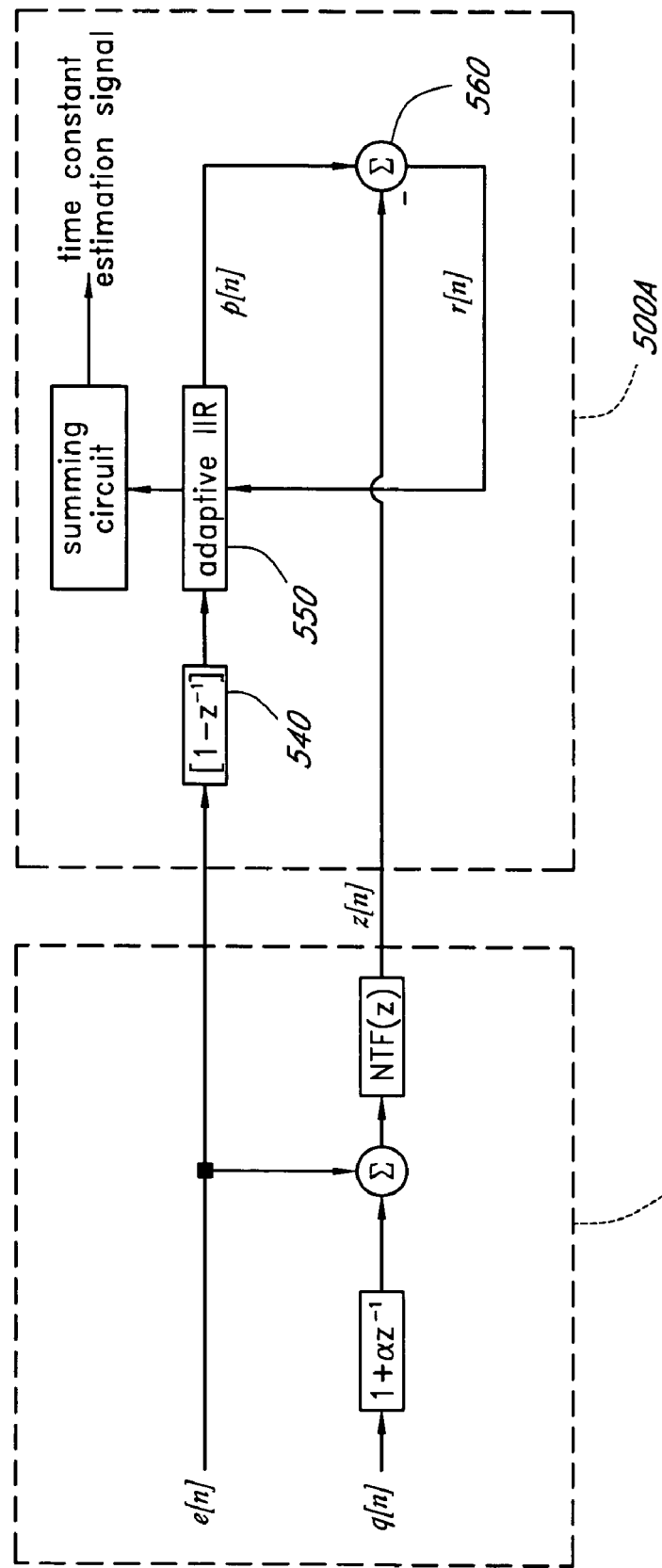
FIG. 10 illustrates another embodiment of a time constant estimator.

FIG. 10 illustrates an alternative embodiment of the time constant estimator 500 that uses an adaptive IIR filter to estimate the noise transfer function of the auxiliary DSM 400. For example, a FIR filter (e.g., $(1-z^{-1})$) 540 is cascaded with an adaptive IIR filter 550 to filter the error sequence e[n], resulting in a sequence p[n]. The adaptive IIR filter 550 is adapted so as to minimize a difference r[n] between p[n] and z[n]. The difference r[n] is generated by a summer 560.

Figure 11:
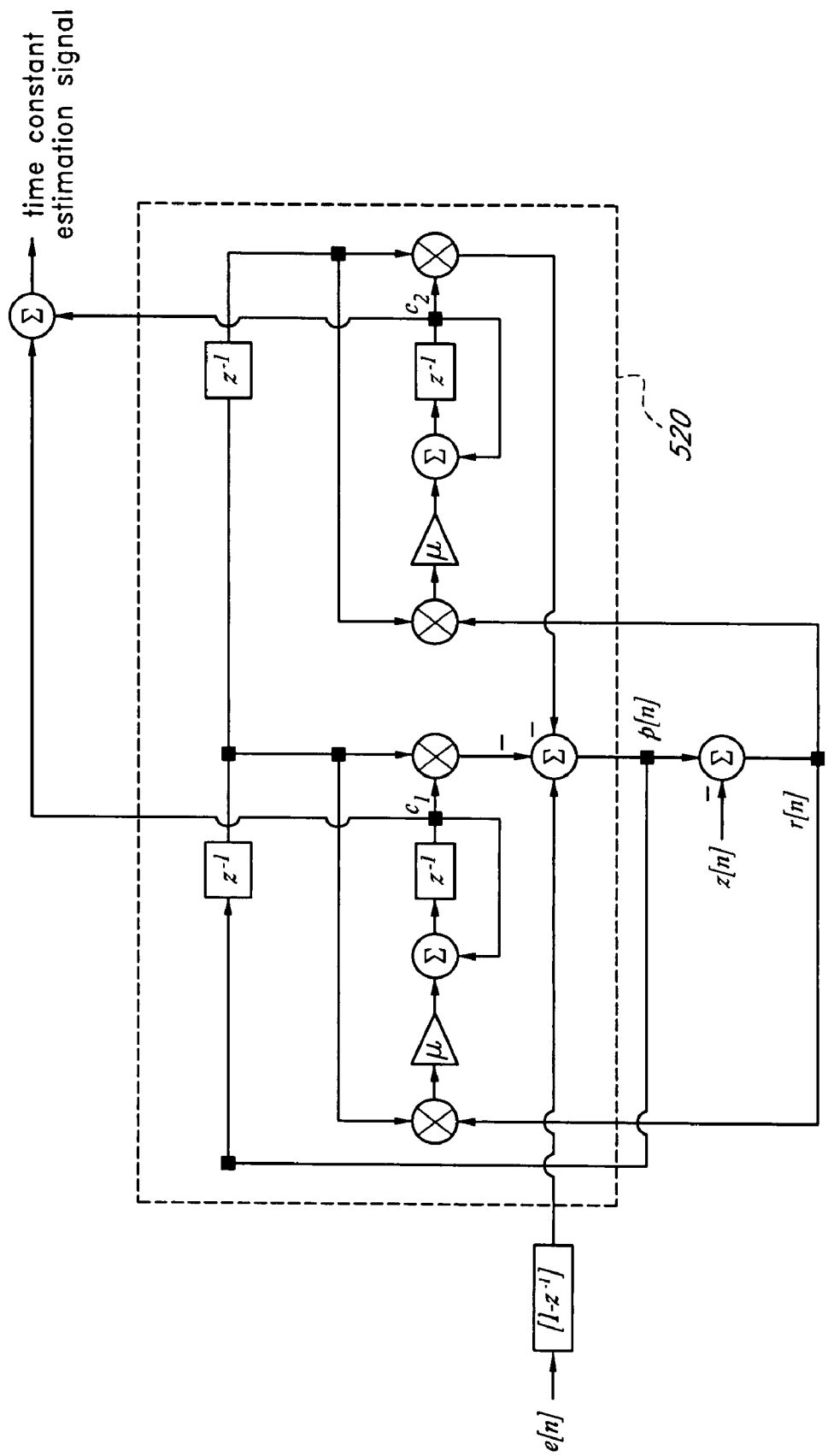
FIG. 11 illustrates another embodiment of an adaptive filter.

FIG. 11 depicts an exemplary embodiment of the adaptive IIR filter 550. The adaptive IIR filter 550 includes a gain factor $\mu$ corresponding to an adaptation step size. In one embodiment, the adaptation step size needs to be small enough for the adaptive IIR filter 550 to converge. In one configuration, the adaptive IIR filter 550 minimizes the residual sequence r[n] using a least-mean-square adaptation scheme. Other adaptation schemes (or algorithms) are possible. Upon convergence, the adaptive IIR filter 550 in cascade with the FIR filter 540 results in a response that matches the noise transfer function of the auxiliary DSM 400. After being properly adapted, the FIR filter 540 in cascade with the adaptive IIR filter 550 has the following response:

$$[1-z^{-1}]/[1+c_1 \cdot z^{-1}+c_2 \cdot z^{-2}], \text{ where}$$

$$c_1 = \alpha + k - k \cdot d - 1 \text{ and}$$

$$c_2 = k \cdot d - \alpha.$$

Similar to the adaptive FIR filter 520 discussed above, the sum of the filter coefficients for the adaptive IIR filter 550 has the following relationship upon convergence:

$$c_1 + c_2 = k - 1.$$

In the schemes presented in FIG. 8 and FIG. 10, the integrator 410 inside the auxiliary DSM 400 is assumed to have zero leakage. In practice, the integrator 410 has some leakage and its response becomes $k/(sT+\beta)$, where $\beta$ is a constant that characterizes the leakage of the integrator. To make the schemes more robust, the leakage is taken into account and the integrator block 510 in FIG. 8 is modified to has a response of $1/[1-\gamma z^{-1}]$ or the differentiation block 540 in FIG. 10 is modified to have a response of $[1-\gamma z^{-1}]$, where $\gamma = \exp(-\beta)$ is the leakage factor of a discrete-time integrator.

Figure 12B:
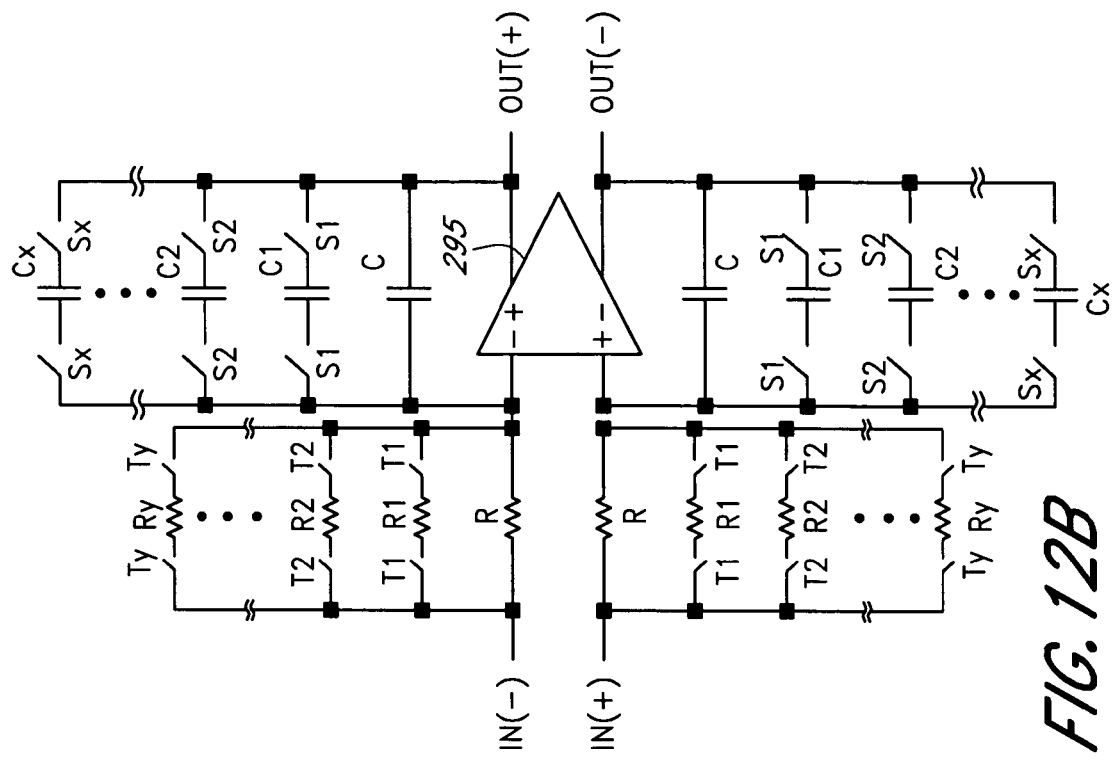
FIGS. 12A and 12B illustrate embodiments of integrators with adjustable time constants.
Figure 12A:
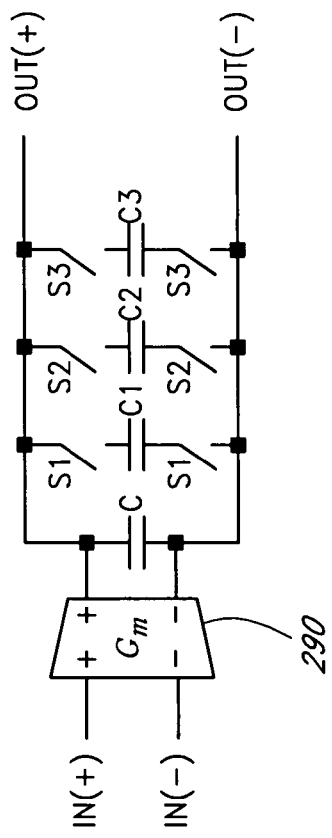

In one embodiment, the time constant estimator 500 outputs a time constant estimation signal to indicate the percentage of error in the time constant of the integrator 410. The time constant estimator 500 provides the time constant estimation signal to the time constant controller 600. The time constant controller 600 provides one or more control signals to adjust the time constant of at least one integrator in the primary DSM 200A. In one embodiment, the control signals also adjust the time constant of the integrator 410 in the auxiliary DSM 400. There are numerous ways to adjust the time constant of a continuous-time integrator. In one embodiment shown in FIG. 12A, an array of capacitors is used to adjust the output capacitance, and therefore the time constant, of an OTA-C integrator. For example, the time constant controller 600 provides control signals S1, S2, and S3 to control switches that allow the integrator to selectively include or exclude capacitors C1, C2, and C3, respectively, as part of its output capacitance. A similar arrangement can be used for an R-C integrator. By way of example, FIG. 12B illustrates an R-C integrator with arrays of resistors and arrays of capacitors for adjusting its time constant.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A calibration circuit for adjusting a time constant of at least one integrator in a primary delta-sigma modulator that is configured to convert a continuous-time input signal into a primary discrete-time output sequence, the calibration circuit comprising:

an auxiliary delta-sigma modulator comprising a continuous-time loop filter with at least one integrator that has a substantially similar circuit design as the integrator of the primary delta-sigma modulator, wherein the auxiliary delta-sigma modulator is configured to generate an error sequence and an auxiliary output sequence in response to a calibrating sequence;

an estimator circuit configured to generate an estimation signal based on the error sequence and the auxiliary output sequence, wherein the estimation signal indicates relative error in a time constant of the integrator in the auxiliary delta-sigma modulator; and a controller circuit configured to adjust the time constant of the integrator in the primary delta-sigma modulator based on the estimation signal.

2. The calibration circuit of claim 1 wherein the estimator circuit comprises an adaptive filter circuit to characterize a correlation between the error sequence and the auxiliary output sequence.

3. The calibration circuit of claim 2 wherein the adaptive filter circuit comprises a fixed finite impulse response filter in cascade with an adaptive infinite impulse response filter.

4. The calibration circuit of claim 2 wherein the adaptive filter circuit comprises a fixed infinite impulse response filter in cascade with an adaptive finite impulse response filter.

5. The calibration circuit of claim 4 wherein the fixed infinite impulse response filter is a discrete-time integrator.

6. The calibration circuit of claim 2 wherein the estimation signal is generated based on at least two filter coefficients of the adaptive filter circuit.

7. The calibration circuit of claim 2 wherein the estimator circuit further comprises a summing circuit that adds at least two filter coefficients of the adaptive filter circuit to generate the estimation signal.

8. The calibration circuit of claim wherein the controller circuit outputs at least one control signal for selectively connecting circuit elements in an array to adjust the time constant for the integrator in the primary delta-sigma modulator.

9. The calibration circuit of claim 1 wherein the auxiliary delta-sigma modulator further comprises a quantizer coupled between the continuous-time loop filter and an output of the auxiliary delta-sigma modulator, and the calibrating sequence is injected into the auxiliary delta-sigma modulator before a quantizer input via a summing circuit.

10. The calibration circuit of claim 1 wherein the auxiliary delta-sigma modulator further comprises a quantizer coupled between the continuous-time loop filter and an output of the auxiliary delta-sigma modulator, and the calibrating sequence is injected into the auxiliary delta-sigma modulator after a quantizer output via a summing circuit.

11. The calibration circuit of claim 10 wherein the auxiliary delta-sigma modulator further comprises a local feedback loop to compensate for excess delay, the local feedback loop comprising:
    a round-off function coupled between the quantizer output and the output of the auxiliary delta-sigma modulator;
    a data flip-flop coupled between the output of the auxiliary delta-sigma modulator and an input to a digital-to-analog converter;
    a gain element with an input coupled to the input of the digital-to-analog converter; and
    a summing circuit configured to subtract an output of the gain element from a sequence at the quantizer output.

12. The calibration circuit of claim 11 wherein the calibrating sequence is injected at one of the following locations: an input of the round-off function and an output of the round-off function.

13. The calibration circuit of claim 11 wherein the error sequence contains additive noise due to the calibrating sequence and the round-off function.

14. The calibration circuit of claim 1 wherein the time constant of the integrator in the primary delta-sigma modulator is adjusted based on at least one of the following: at start-up, intermittently, in response to a user command signal, periodically and continuously.

15. The calibration circuit of claim 1 wherein the calibrating sequence is a pseudo-random noise sequence.

16. The calibration circuit of claim 1 wherein the calibrating sequence is a periodic sequence.

17. The calibration circuit of claim 1 wherein the auxiliary delta-sigma modulator is a first order modulator comprising one integrator, a quantizer and a feedback digital-to-analog converter.

18. The calibration circuit of claim 1 wherein the primary delta-sigma modulator is a higher order modulator than the auxiliary delta-sigma modulator.

19. A method of calibrating a time constant for at least one integrator in a primary delta-sigma modulator that is configured to generate a primary discrete-time output sequence in response to a continuous-time input signal, the method comprising:
    injecting a calibration sequence into an auxiliary delta-sigma modulator that comprises at least one integrator with a substantially similar circuit design as the integrator of the primary delta-sigma modulator;
    generating an estimation signal indicative of percentage error in a time constant of the integrator in the auxiliary delta-sigma modulator, wherein the estimation signal is based on correlation between a discrete-time output sequence of the auxiliary delta-sigma modulator and an error sequence containing additive noise due to the calibration sequence; and
    adjusting the time constant of the integrator in the primary delta-sigma modulator in response to the estimation signal.

20. The method of claim 19 wherein generating the estimation signal comprises:
    using an adaptive filter to estimate a noise transfer function of the auxiliary delta-sigma modulator; and
    summing at least two filter coefficients of the adaptive filter.

21. The method of claim 19 wherein adjusting the time constant comprises selectively connecting circuit components in an array to the integrator in the primary delta-sigma modulator.

22. The method of claim 19 wherein the calibration sequence is injected at one of the following locations: before a quantizer input and after a quantizer output.

23. The method of claim 19 wherein the primary delta-sigma modulator is a higher modulator than the auxiliary delta-sigma modulator.

24. A calibration circuit for adjusting an integrator time constant in a first delta-sigma modulator, the calibration circuit comprising:
    means for generating an error sequence and a discrete-time output sequence in a second delta-sigma modulator in response to a calibrating sequence, wherein the error sequence contains additive noise due to the calibrating sequence;

means for estimating a percentage error in the integrator time constant in the first delta-sigma modulator based on the error sequence and the discrete-time output sequence in the second delta-sigma modulator; and means for adjusting the integrator time constant in the first delta-sigma modulator based on the estimated percentage error.

25. A circuit for estimating a time constant in a first delta-sigma modualtor, the circuit comprising:

a second delta-sigma modulator configured to receive a calibrating sequence and comprising a continuous-time loop filter with at least one integrator, wherein the second delta-sigma modulator is configured to generate a first sequence containing additive noise due to the calibrating sequence and a second sequence in response to the calibrating sequence;

an estimator circuit configured to generate an estimation signal based on a correlation between the first sequence and the second sequence, wherein the estimation signal indicates an error in a time constant of the integrator in the second delta-sigma modulator; and a controller circuit configured to adjust the time constant of an integrator in the first delta-sigma modulator based on the estimation signal.

26. The circuit of claim 25 wherein the estimator circuit comprises an adaptive filter circuit to characterize the correlation between the first sequence and the second sequence.

27. The circuit of claim 25 wherein the controller circuit outputs at least one control signal for selectively connecting circuit elements in the first delta-sigma modulator to adjust the time constant of its integrator.

28. The circuit of claim 25 wherein the second delta-sigma modulator and the first delta-sigma modulator are realized in a common monolithic integrated circuit.

29. The circuit of claim 25 wherein the first delta-sigma modulator is a higher order modulator than the second delta-sigma modulator.

30. A method for estimating a time constant in a first delta-sigma modulator, the method comprising:

injecting a calibration sequence into a second delta-sigma modulator that comprises at least one integrator;

generating an estimation signal indicative of an error in a time constant of the integrator in the second delta-sigma modulator, wherein the estimation signal is based on a correlation between an output sequence of the second delta-sigma modulator in response to the calibration sequence and an error sequence containing additive noise introduced to the second delta-sigma modulator due to the calibration sequence and adjusting the time constant of an integrator in the first delta-sigma modulator in response to the estimation signal by selectively connecting circuit components in an array.

31. The method of claim 30 wherein the first delta-sigma modulator is a higher order modulator than the second delta-sigma modulator.

32. A method for estimating a time constant, the method comprising:

injecting a calibration sequence into a delta-sigma modulator that comprises at least one integrator; and generating an estimation signal indicative of an error in a time constant of the integrator in the delta-sigma modulator, wherein the estimation signal is based on a correlation between the output sequence of the delta-sigma modulator in response to the calibration sequence and an error sequence containing additive noise introduced to the delta-sigma modulator due to the calibration sequence, and wherein generating the estimation signal further comprises:

using an adaptive filter to estimate a transfer function of the delta-sigma modulator; and summing at least two filter coefficients of the adaptive filter.

* * * * *

UNITED STATES PATENT AND TRADEMARK OFFICE
CERTIFICATE OF CORRECTION

PATENT NO.       : 7,321,325 B2
APPLICATION NO.  : 11/389990
DATED            : January 22, 2008
INVENTOR(S)      : Hong-Yean Hsieh et al.

It is certified that error appears in the above-identified patent and that said Letters Patent is hereby corrected as shown below:

In Column 2, Line 9 (Approx.), after "$(z^2+4z+1)/$" delete "(z-1)" and insert -- $(z-1)^3$. --, therefor.

In Column 9, Line 35 (Approx.), in Claim 8, delete "claim" and insert -- claim 1 --, therefor.

In Column 12, Line 11 (Approx.), in Claim 30, delete "sequence and" and insert -- sequence; and --, therefor.

Signed and Sealed this

Eighth Day of July, 2008

JON W. DUDAS
*Director of the United States Patent and Trademark Office*